(12) United States Patent
Johnson et al.

(10) Patent No.: US 8,404,336 B2
(45) Date of Patent: Mar. 26, 2013

(54) SUPERLATTICE AND TURBOSTRATICALLY DISORDERED THERMOELECTRIC MATERIALS

(75) Inventors: David C. Johnson, Eugene, OR (US); Ngoc Nguyen, Eugene, OR (US)

(73) Assignee: State of Oregon Acting by and Through the State Board of Higher Education on Behalf of the University of Oregon, Eugene, OR (US)

( * ) Notice: Subject to any disclaimer, the term of this patent is extended or adjusted under 35 U.S.C. 154(b) by 702 days.

(21) Appl. No.: 12/090,849

(22) PCT Filed: Oct. 20, 2006

(86) PCT No.: PCT/US2006/041046
§ 371 (c)(1), (2), (4) Date: Apr. 18, 2008

(87) PCT Pub. No.: WO2007/047928
PCT Pub. Date: Apr. 26, 2007

(65) Prior Publication Data
US 2008/0226890 A1    Sep. 18, 2008

Related U.S. Application Data

(60) Provisional application No. 60/728,847, filed on Oct. 20, 2005.

(51) Int. Cl.
*B32B 33/00* (2006.01)
(52) U.S. Cl. ....................................... 428/220
(58) Field of Classification Search ............. 428/220
See application file for complete search history.

(56) References Cited

U.S. PATENT DOCUMENTS

| | | | |
|---|---|---|---|
| 3,362,853 A | 1/1968 | Valdsaar | |
| 5,900,071 A | 5/1999 | Harman | |
| 2003/0099279 A1* | 5/2003 | Venkatasubramanian et al. | 374/179 |
| 2004/0107988 A1* | 6/2004 | Harman et al. | 136/205 |
| 2005/0150539 A1 | 7/2005 | Ghoshal et al. | |
| 2006/0107891 A1* | 5/2006 | Zurbuchen | 117/92 |

FOREIGN PATENT DOCUMENTS

| | | |
|---|---|---|
| CA | 2589107 | 6/2006 |
| DE | 299 16 723 | 9/1999 |
| DE | 100 47 465 A1 | 9/2000 |
| WO | WO 01/17035 A1 | 3/2001 |
| WO | WO 2004012263 A1 * | 2/2004 |
| WO | WO 2006005126 A1 * | 1/2006 |
| WO | WO 2006/058782 A1 | 6/2006 |
| WO | WO 2007/047928 A3 | 4/2007 |

OTHER PUBLICATIONS

Noh and Johnson, "Designed Synthesis of [TiSe2]m[NbSe2]n Superlattices from Modulated Reactants," Dec. 1996, Agnew. Chem. Int. Ed. Engl., 35 No. 22, pp. 2666-2669.*
Touzelbaev et al., "Thermal characterization of Bi2Te3/Sb2Te3 superlattices," Jul. 15, 2001, Journal of Applied Physics, vol. 90, No. 2, pp. 763-767.*

(Continued)

*Primary Examiner* — Maria Veronica Ewald
*Assistant Examiner* — Laura Auer
(74) *Attorney, Agent, or Firm* — Klarquist Sparkman, LLP

(57) ABSTRACT

Layered materials are provided that have surprisingly low thermal conductivities. A plurality of layers of a selected material such as, for example, tungsten diselenide, is formed by a modulated elemental reactants method to produce a low thermal conductivity material. The layers are generally stacked but substantially randomly arranged as stacked.

16 Claims, 5 Drawing Sheets

OTHER PUBLICATIONS

International Search Report of the International Searching Authority from PCT/US2006/041046, mailed May 15, 2008.

Billinge et al., "Beyond Crystallography: The Study of Disorder, Nanocrystallinity and Crystallographically Challenged Materials with Pair Distribution Functions," *Chem. Commun.*, 7:749-760, 2004.

Böttner et al., "Aspects of Thin-Film Superlattice Thermoelectric Materials, Devices, and Applications," *MRS Bulletin*, 31:211-217, 2006.

Costescu et al., "Ultra-Low Thermal Conductivity in $W/Al_2O_3$ Nanolaminates," *Science*, 303:989-990, 2004.

Harris et al., "Turbostratic Disorder in $[(Bi_2Te_3)_X(TiTe_2)_y]$ Superlattices," *Mat. Res. Soc. Symp. Proc.*, 793:29-34, 2004.

Li et al., "Attempted Synthesis of $(Bi_2Te_3)x$ $(SnTe)_Y$ Misfit Layer Compounds," *2005 24$^{th}$ International Conference on Thermoelectrics (ICT)*, 299-300, Jun. 19-23, 2005.

Shelimova et al., "Crystal Structure and Thermoelectric Properties of the Mixed Layered Compounds of the $(GeTe)_n(Bi_2Te_3)_m$ Homologous Series," *16$^{th}$ International Conference on Thermoelectrics*, 481-484, 1997.

Chiritescu et al., "Ultralow Thermal Conductivity in Disordered, Layers $WSe_2$ Crystals," *Science*, 315:351-353, (2007).

Goodson, "Ordering Up the Minimum Thermal Conductivity of Solids," *Science*, 315:342-343, (2007).

\* cited by examiner

SUPERLATTICE AND TURBOSTRATICALLY DISORDERED THERMOELECTRIC MATERIALS

CROSS REFERENCE TO RELATED APPLICATIONS

This is the U.S. National Stage of International Application No. PCT/US2006/041046, filed Oct. 20, 2006, which was published in English under PCT Article 21(2), which in turn claims the benefit of U.S. Provisional Application No. 60/728,847, filed Oct. 20, 2005. Both applications are incorporated by reference herein.

ACKNOWLEDGMENT OF GOVERNMENT SUPPORT

The invention was made with government support under contract ONR N000140410407 awarded by the United States Office of Naval Research. The government has certain rights in the invention.

FIELD

The disclosure pertains to thermoelectric materials and devices.

BACKGROUND

Thermoelectric devices can be configured to both create power and pump heat, making such devices widely applicable in a variety of commercial, consumer, and military applications. For example, thermoelectrics have been suggested as power sources for remote sensors that can extract power for their operation based on, for example, existing thermal gradients such as a temperature difference between the air and the sea. Thermoelectric devices have other desirable features for many applications. For example, thermoelectric devices can operate with no moving parts and thus can operate silently. These and other uses would be significantly enhanced with higher performing thermoelectric devices. While advances in thermoelectric technology have been made, improved thermoelectric materials are necessary for many practical applications.

SUMMARY

Disordered materials are provided that exhibit surprisingly low thermal conductivities, substantially lower than the thermal conductivities of the corresponding bulk materials, and can permit thermoelectric figures of merit (ZT) greater than about 2. Some compositions consist essentially of tungsten selenide and having a thermal conductivity of less than about $0.2\ W\ m^{-1}\ K^{-1}$. In some examples, the thermal conductivity is less than about $0.05\ W\ m^{-1}\ K^{-1}$. In representative examples, compositions comprise a plurality of tungsten selenide layers. In additional examples, the layers are substantially randomly oriented about an axis perpendicular to a plane that is substantially parallel to the layers. According to some examples, the tungsten selenide is arranged as a series of layers along an axis that is substantially perpendicular to the layers, and the thermal conductivity is associated with heat transfer in a direction parallel to the axis. In representative examples, a thickness of the layers is between about 1 nm and about 250 nm or between about 4 nm and about 75 nm.

Methods of fabricating a thermal material comprise depositing a plurality of layers of a first constituent and a second constituent and annealing the pluralities of layers so as to produce a corresponding plurality of product layers, wherein each product layer consists essentially of a compound of the first constituent and the second constituent. In some examples, the product layers are configured so as to be substantially randomly oriented about an axis perpendicular to a plane that is substantially parallel to the product layers. In additional examples, the constituent layers are annealed so that the product layers consist essentially of the crystalline compound. In further examples, thicknesses of the constituent layers are selected to be in a range of from about 1 nm to about 500 nm. According to further examples, the thicknesses of the constituent layers are selected to be in a range of from about 5 nm to about 55 nm. In some examples, a thermal property is established by exposing the material to an ion beam flux. In additional representative examples, the first plurality of layers is associated with a first thickness, and a second plurality of layers of the first and second constituents is deposited, wherein the second plurality of layers is associated with a second thickness. In one example, the product layers consist essentially of tungsten selenide. In other examples, the second plurality of layers is associated with one or more additional constituents.

Compositions comprise a first series of layers of a first compound and a second series of layers of a second compound interleaved with the layers of the first compound. A thickness of the layers is less than about 250 nm, and the layers are configured so as to be substantially randomly oriented about an axis perpendicular to a plane that is substantially parallel to the layers. In some examples, the first series of layers consists essentially of $Bi_2Te_3$ and the second series of layers consists essentially of $TiTe_2$. In additional examples, the first series of layers consists essentially of CeSe and the second series of layers consists essentially of $NbSe_2$. In further representative examples, the first series of layers consists essentially of BiSe and the second series of layers consists essentially of $NbSe_2$. In still additional embodiments, a total thickness of the first and second series of layers is less than about 500 nm, and the layers of at least one of the first series of layers and the second series of layers are substantially randomly oriented layers.

The foregoing and other objects, features, and advantages of the disclosed technology will become more apparent from the following detailed description, which proceeds with reference to the accompanying figures.

DETAILED DESCRIPTION

Figure 1:
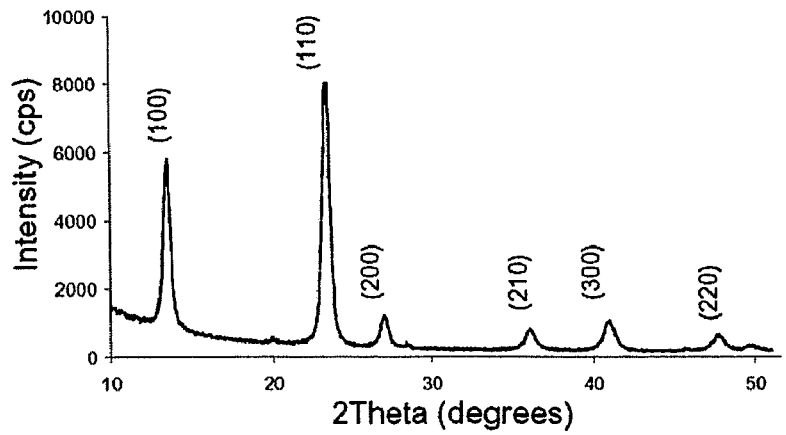
FIG. 1 is a graph of in-plane diffraction data obtained with an 18.5 keV energy beam in which all $(hk_0)$ diffraction peaks of tungsten diselenide can be identified.

Turbostratically disordered materials are disclosed that provide surprisingly low thermal conductivities and can serve to control heat flow as well as serve as thermoelectric materials. Such materials can be formed as so-called "superlattices" that are laminates of two or more different compounds. Individual components of such a superlattice can be prepared in the same manner as the superlattice (vapor deposition and annealing of, for instance, $WSe_2$), but the superlattice can exhibit a thermal conductivity that is substantially lower than that expected for the bulk material. Repeated layers of a single material can also be used, and superlattice arrangements are not required.

Turbostratically disordered materials as described herein are neither completely crystalline nor completely amorphous. Such materials generally are ordered in a series of planes and along an axis perpendicular to the planes, but the planes are randomly or quasi-randomly stacked so there is no or reduced ordering between the planes. If materials with suitable electronic properties such as, for example, thermoelectric properties are formed with turbostratic disorder, then thermal conductivity can be lowered, thereby improving thermoelectric properties. Such turbostratically disordered materials can also be used generally in applications in which relatively low thermal conductivity is desired. Thus, "turbostratically disordered" structure permits superior thermal and thermoelectric properties.

Low thermal conductivity solids are provided by arranging a series of layers of one or more constituents (elements or compounds) adjacent each other. The layers typically have long range order such as the crystallographic order associated with bulk constituents. However, the layers are randomly stacked or otherwise arranged so that there is little long range order among the layers. For example, a composition can be formed as a series of substantially identical crystalline layers similar to thin plates. Each plate can be oriented so that a selected crystal axis (for example, a z-axis) is substantially perpendicular to the plate, while other crystal axes are in a plane of the plate or otherwise arranged. The plates are stacked so that each plate shares a common z-axis direction but so that one or more crystal axes are randomly arranged. As used herein, a random arrangement is a configuration in which the ordered arrangement of a plate within a plane perpendicular to a stacking direction (a z-axis direction) plates is substantially uncorrelated to the ordered arrangement within other plates. Thus, an ordered arrangement with an xy plane of a particular plate is uncorrelated or weakly correlated to the ordered arrangement in xy-planes of other plate. In some examples, adjacent or close layers can exhibit some correlation in their ordering, but this correlation can be weak and tends to diminish as a function of layer separation. In other examples, layers are stacked along a z-axis direction, but the layers have arbitrary internal ordering. It will be appreciated that layers need not have long range order throughout, and layers can have varying orientations as a function of position. For convenience, such arrangements are referred to herein as disordered.

Typically compositions consist of a plurality of such layers that are formed by deposition of a series of layers and layer constituents on a substrate. Subsequent processing is carried out to provide order within the layer, but so that the layers do not adopt a common, coherent order. The disclosed compositions are solid compositions having densities comparable to the bulk densities of the layer materials. Typically, layer and multilayer densities are at least about 50% of bulk density.

Representative turbostratically disordered materials described herein are based on $WSe_2$ and BiTe/SbTe alloys and other compositions. For example, superlattice compounds consisting of interleaved layers of bismuth telluride and/or antimony telluride with structurally related van der Waal compounds are disclosed.

For superior thermoelectric performance, a product of the electrical conductivity and the Seebeck coefficient squared (the so-called power factor) of a material should be relatively large and the thermal conductivity relatively low. Disclosed herein are representative examples of materials having surprisingly low thermal conductivities as well as unexpected electrical properties. For example, $(Bi_2Te_3)_x(TiTe_2)_y$ compounds are semiconducting for small values of y, even though $TiTe_2$ is reported to be a semimetal.

Films of selected superlattice compositions can be formed using, for example, a modulated elemental reactant method such as described in, for example, PCT Patent Publ. 2004/012263 and U.S. Pat. No. 5,994,639. In general, thermodynamically metastable crystalline compounds having a selected crystal structure are prepared through controlled crystallization of amorphous reaction intermediates formed by low-temperature interdiffusion of modulated elemental reactants. The modulated elemental reactants are generally produced by layering thin films of the elements, wherein the layers are thin enough that they will interdiffuse at low temperatures, forming an amorphous reaction intermediate, before they nucleate (i.e., crystallize). The amorphous reaction intermediate for each system typically nucleates exothermically at about 200° C., forming a selected compound. At temperatures above about 500° C., such metastable compounds tend to decompose exothermically forming a thermodynamically stable mixture of binary compounds and elemental components.

Some disclosed compounds comprise crystalline alloys of two or more solid-state reactants and are produced on a surface of a solid substrate, such as a silicon wafer. Each crystalline alloy is formed by first forming one or more modulated elemental reactants or "repeat units," of reactant layers superposedly on the substrate surface. Each repeat unit may contain the same number of elemental layers. The stoichiometry of the desired crystalline alloy is determined by the relative thicknesses of the elemental reactant layers comprising the repeat units. When at least three reactants are used, the stoichiometry is determined in part by the number of layers of a particular reactant in a repeat unit relative to the number of layers of each of the other reactants in the repeat unit.

Modulated elemental reactants are typically prepared using an ultra-high-vacuum deposition apparatus. The repeat units are prepared on substrate wafers comprised of materials such as (but not limited to), silicon, quartz, or float glass. A group of such wafers is typically mounted in the vacuum chamber of the deposition apparatus on sample mounts to undergo planetary rotation in a vacuum chamber during deposition. Reactant layers can be deposited on the wafers using any of various methods known in the art including, but not limited to, sputtering, vapor deposition, and electron-beam gun deposition. Deposition rates typically are adjusted within a range of about 0.05-0.2 nm/sec. Deposition rates may, however, be much higher or lower depending on variables known to those skilled in the art. The vacuum in the chamber during deposition is typically between $10^{-7}$ and about $10^{-9}$ Torr.

Layers, when deposited, can be either amorphous or crystalline (as can be determined via x-ray diffraction). Interdiffusion of either type of layer can be conducted at a temperature that will overcome the activation energy of diffusion for the various layers. In general, the activation energy of diffusion for crystalline reactants is higher than for amorphous reactants. After forming a repeat unit of the reactants on the substrate, the repeat units are heated to an interdiffusion temperature for the reactants. The interdiffusion temperature is less than the nucleation temperature for the reactants. A suitable interdiffusion temperature, generally in the range of several hundred degrees Celsius, can be readily determined by performing differential scanning calorimetry (DSC) of the modulated composite using methods generally known in the art. The interdiffusion temperature is maintained until the reactants have achieved a homogeneous interdiffusion, thereby forming a homogeneous amorphous alloy of the reactants.

After forming the amorphous alloy, the amorphous alloy is heated to a nucleation temperature. The nucleation temperature is maintained until the amorphous alloy becomes fully crystallized. With certain alloys, however, once nucleation begins, crystallization progresses to completion even when the temperature of the alloy is reduced to below the nucleation temperature before crystallization is complete. In some examples, nucleation and interdiffusion are produced at a single "annealing" temperature.

For any modulated composite, there is typically a preferred thickness parameter associated with a maximum repeat-unit thickness than can interfuse to homogeneity without triggering nucleation. In general, keeping the repeat-unit thickness to about 10 nm or less effectively allows formation of a homogeneous amorphous alloy of reactants without nucleation, but thicknesses of up to 500 nm or larger can be used for some materials.

Materials that comprise interleaved Van der Waal compounds can provide several advantages such as, for example, superior doping density control, reduced electron scattering, turbostratic disorder due to lattice mismatches, strain relief (including thermal strain relief) as layers are free to "slide over" one another. A large number of van der Waal (VDW) compounds with a wide variety of physical properties can be suitable, including high density of states metals ($VX_2$, $NbX_2$, $TaX_2$ wherein X is a chalcogen), semiconductors of varying band gaps ($MoX_2$, $WX_2$, $Ga_2X_3$, $Sb_2X_3$, and $Bi_2X_3$ where X is a chalcogen, semimetals ($TiX_2$, $ZrX_2$, and $HfX_2$), and magnetic materials (transition metal intercalates of dichalcogenides).

A representative method of preparing a superlattice system of a selected composition includes calibrating deposition sources so that a stoichiometrically appropriate composition of elements for each component of the desired final superlattice can be deposited. This calibration can be done by, for example, making six multilayer samples, three containing a repeating unit with a fixed thickness of a first constituent A and varying thickness of a second constituent B, and three samples with a fixed thickness of B and varying thickness of A. Low angle x-ray diffraction of the samples can be used to determine repeat layer thicknesses based on a position of the Bragg reflections resulting from the layering. Plotting the measured thickness of each set of three samples against the intended thickness of the varying layer produces the thicknesses of the component layers that can be used to establish a tooling factor. Electron microprobe data collected as a function of accelerating voltage can be fit to yield the composition of these samples. This information is used to create a series of three samples with compositions matching the stoichiometry of the desired component compound, varying the intended total thickness of the repeating unit. These samples are then annealed at low temperatures (typically less than about 500° C.) to yield the desired crystalline compound to obtain both processing information and an amount the films contract on crystallization. The repeat layer thickness required to avoid interfacial nucleation of competing compounds is determined. Preparing samples with the bilayer thicknesses below this value permits the desired compound to be formed directly from the amorphous precursor. With all of this information, it is straightforward to calculate the bilayer thicknesses required to form a single unit cell of the desired compound.

Having obtained this information for the desired component compounds, the individual bilayer units calculated to give a single unit cell can be repeated to give the desired number of unit cells of each component and interleaved to produce a reactant that will evolve to the desired compound. In some examples, unit cells of a single type or multiple types are used. Typically, diffraction data collected as a function of annealing temperature and time can be used to select preferred annealing conditions based small angle and large angle diffraction peaks. Rapid thermal annealing and/or extended low temperature annealing is used to optimize grain growth while limiting interdiffusion of the layers. Suitable materials can include $(Bi_2Te_3)_x(TiTe_2)_y$, $(Bi_2Te_3)_x(HfTe_2)_y$, $(Sb_2Te_3)_x(TiTe_2)_y$, and $(Sb_2Te_3)_x(HfTe_2)_y$ based on a 5 layer VDW compound (Te—Bi—Te—Bi—Te) and a 3-layer VDW compound (Te—Hf—Te), $(Bi_2Te_3)_x(TiTe_2)_y(Sb_2Te_3)_z$ based on two 5-layer VDW compounds interleaved with a 3-layer VDW compound, $(Bi_2Te_3)_x(PbTe)_y$ based on a 5 layer VDW compound interleaved with a rock salt structure, and $(TiTe_2)_x(PbTe)_y$ based on a 3 layer VDW compound interleaved with a rock salt structure. Doping of the rock salt layer with electron donors (3+ cations in place of lead) or electron deficient (1+ cations in place of lead) can be used to select suitable charge transfer characteristics.

Initial synthesis optimization and electrical characterization can be done on thin film samples. Typically 200-400 nm thick films based on multiple repeat units are prepared on either glass or sapphire substrates for electrical measurements, on smooth silicon wafers for process optimization and on mis-cut quartz for structural characterization. Films can be analyzed with a sequence of low and high angle x-ray diffraction (XRD) measurements, SEM, Microprobe and TEM to characterize their structure. The initial electrical measurements on a system are collected as a function of annealing temperature and time because there are typically large changes in both conductivity and Seebeck coefficients during annealing, probably due to non-equilibrium defect concentrations trapped in these materials during crystallization. This procedure is useful as extended annealing allows measurement of properties as a function of carrier concentration with only a single sample. This procedure is used to select doping and annealing conditions to obtain predetermined electrical properties.

REPRESENTATIVE EXAMPLES

Methods and apparatus are described for particular examples pertaining to compounds based on two or three different component constituents with a controlled repeat pattern. For example, different repeat patterns of compositions such as ABC, ABCB etc., wherein A, B and C represent different constituent compounds can be provided and controlled. $(Bi_2Te_3)_x(TiTe_2)_y$, $WSe_2$, and $WSe_2/W$ superlattices and films having extremely low thermal conductivities can be produced. Bulk superlattice pellets such as a 2×2×8 mm³ $(Bi_2Te_3)_5(TiTe_2)_4$ superlattice pellet with a c-lattice orientation perpendicular to a pellet long axis can be formed. Representative examples such as a 500 nm film of $(Bi_2Te_3)_5(TiTe_2)_4$, and various compositions of the form $(Bi_2Te_3)_x(TiTe_2)_y$ have been prepared. Modulation of layering decreases as a function of increasing annealing temperature, but such films still demonstrate layering structure and can exhibit lowered thermal conductivity. In other examples, several films of materials of the form $(Bi_2Te_3)_x(TiTe_2)_y(Sb_2Te_3)_z$ and $(Bi_2Te_3)_x(TiTe_2)_y(Sb_2Te_3)z(TiTe_2)y$ have been demonstrated. Other superlattices such as, for example, $(CeSe)_x(NbSe_2)_y$, and $(BiSe)_x(NbSe_2)_y$ have been prepared.

Multilayer thin films of metals and metal oxides can be configured to have surprisingly low thermal conductivity. Typically, multilayer compositions having layer thicknesses and spacings of less than about 50 nm, 25 nm, 10 nm, or 5 nm can have a thermal conductivity substantially less that that of a corresponding homogenous metal or metal oxide. Low thermal conductivity of such multilayer compositions may be due to thermal resistance at layer interfaces.

In an example, ten n-type $(Bi_2Te_3)_6(TiTe_2)_3$ superlattice film samples were produced having similar low angle and high angle diffraction patterns. After annealing, all films were crystallographically similar based measured diffraction patterns. Average resistivity was about 0.8 mOhm-cm at room temperature with a range of about 0.5 to 1.0 mOhm-cm. All of the films had similar temperature dependences, with different low temperature intercepts, suggesting that the differences in the films resulted from a difference in the concentration of defects. The measured Seebeck coefficients at room temperature ranged from −30 to −100 µV/K with an average value of −50 µV/K. The Seebeck coefficient of these films increases with annealing time, increasing to about −140 µV/K, suggesting that the number of carriers is being reduced with annealing. About 1.6 grams of a $(Bi_2Te_3)_6(TiTe_2)_3$ superlattice was formed by depositing approximately 20 thick films of this material on polymer coated six inch wafers.

In another representative example, a thermal conductivity of a disordered thin film of a layered crystal of tungsten diselenide ($WSe_2$), can be less than about 0.2 W m$^{-1}$ K$^{-1}$ and at least as small as about 0.05 W m$^{-1}$ K$^{-1}$. A minimum thermal conductivity for a bulk specimen of this material is about 0.3 W m$^{-1}$ K$^{-1}$. In some examples, disruption of a layered structure by ion irradiation can produce a substantial increase in thermal conductivity. Thus, ultra-low thermal conductivity in this material may be of function of material order, and the low thermal conductivities can be produced by random stacking of well-ordered $WSe_2$ crystalline sheets.

$WSe_2$ thin films are synthesized by a modulated elemental reactants (MER) method such as described in Moss et al., Chemistry of Materials 8:1625 (1996). $MoSe_2$ or other films can be similarly synthesized. Sequential bilayers of W (or Mo) and Se are deposited in an ultra high vacuum (about 10$^{-7}$ Torr) onto unheated Si (100) wafers with a stoichiometry of 1:2. The samples are subsequently annealed for one hour at elevated temperatures in $N_2$ atmosphere to promote the formation of the desired layered structures. In the $WSe_2$ structure, a hexagonal sheet of W atoms is bound to two Se layers by strong covalent-ionic bonds and each $WSe_2$ layer is bonded to adjacent layers by weak van der Waals forces. A single crystal foil of $WSe_2$ was used to provide a comparison between the thermal conductivities of a well-ordered crystal and the disordered thin films. Thermal conductivity was measured using time-domain thermoreflectance as described in, for example, C. A. Paddock, G. L. Eesley, J. Appl. Phys. 60: 285 (1986) and R. J. Stoner, H. J. Maris, Phys. Rev. B 48: 16373 (1993) using a thin layer of Al (60-85 nm thick) deposited by magnetron sputtering as a transducer layer. The details of the data acquisition and analysis have been described previously in, for example, D. G. Cahill, Rev. Sci. Instrum. 75:5119 (2004). Thermal conductivity can be determined by comparing the time dependence of the ratio of in-phase $V_{in}$ and the out-of-phase $V_{out}$ signals from a lock-in amplifier to calculations based on a thermal model.

As shown in FIG. 1, diffraction data for a representative sample film shows all expected (hk0) diffraction maxima and can be used to determine a value of a lattice parameter a that corresponds to the known value. The intensities of the (hk0) maxima remain constant with sample rotation indicating a random rotational distribution of the sheets. Only weak and very broad (hk1) diffraction maxima are observed on searching reciprocal space, suggesting a limited amount of rotational order between $WSe_2$ layers and a limited domain size.

Figure 2:
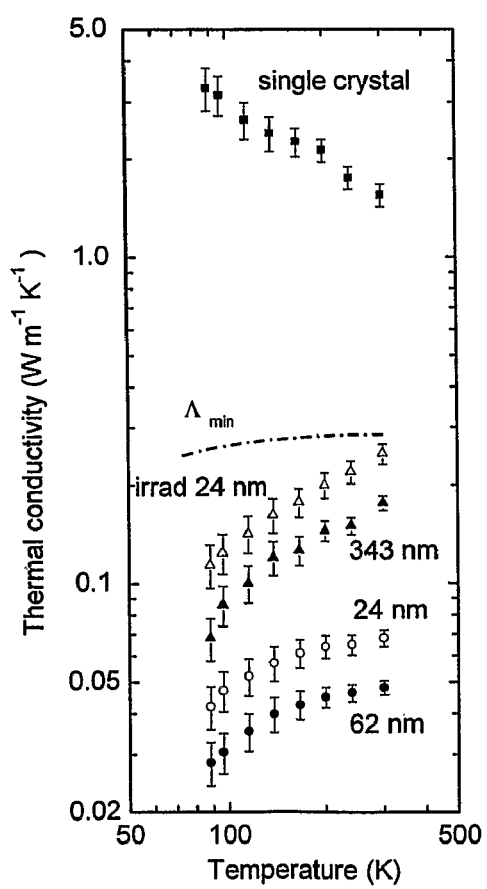
FIG. 2 contains graphs of measured thermal conductivities of $WSe_2$ layers as a function of measurement temperature. Each curve is labeled with a layer thickness and data for a bulk specimen is included for reference. The ion-irradiated sample was subjected to a 1 MeV $Kr^+$ ion dose of $3\times10^{15}\ cm^{-2}$. The solid line marked $\Lambda_{min}$ is a calculated minimum thermal conductivity for $WSe_2$ based on a longitudinal speed of sound measured in a cross-plane direction (1.6 nm/ps) and an estimate of a transverse speed of sound (1.15 nm/ps).

FIG. 2 shows measured thermal conductivity of annealed films, conductivity of single crystal $WSe_2$, and a predicted minimum thermal conductivity $\Lambda_{min}$. The theoretical minimum thermal conductivity is based on the assumption that the lifetime of every vibrational mode in a Debye model of the solid has a lifetime of one-half of the vibrational period; the inputs to this phenomenological model are the number density of atoms and the speeds of sound. The longitudinal speed of sound in the cross-plane direction of nominal 360 nm thick films is $v_L$=1.6 nm ps$^{-1}$ using picosecond acoustics. With $v_L$=1.6 nm ps$^{-1}$ and a mass density of p=9.2 g cm$^{-3}$, the elastic constant is $C_{33}$=23.6 GPa, comparable to $C_{33}$ for $NbSe_2$ and $TaSe_2$. The transverse speed of sound $v_T$ can be estimated as $v_T$=1.15 nm ps$^{-1}$ from $v_L$ and a ratio of $C_{33}$ to $C_{44}$ previously measured for $NbSe_2$ and $TaSe_2$.

The lowest thermal conductivity of $WSe_2$ films measured at 300 K is 0.048 W m$^{-1}$ K$^{-1}$ for a 62 nm thick layer, 30 times smaller than the cross-plane thermal conductivity of single-crystal sample of $WSe_2$ (FIG. 2) and a factor of 6 smaller than the predicted minimum thermal conductivity. The conductivity of the 62 nm thick film is smaller than the conductivity of a thinner film (24 nm thick) or a thicker film (343 nm thick). Thermal conductivity of single crystal $WSe_2$ is approximately proportional to the reciprocal of the absolute temperature as expected for a dielectric or semiconductor material where heat transport is dominated by phonons with mean-free-paths limited by anharmonicity.

Figure 3:
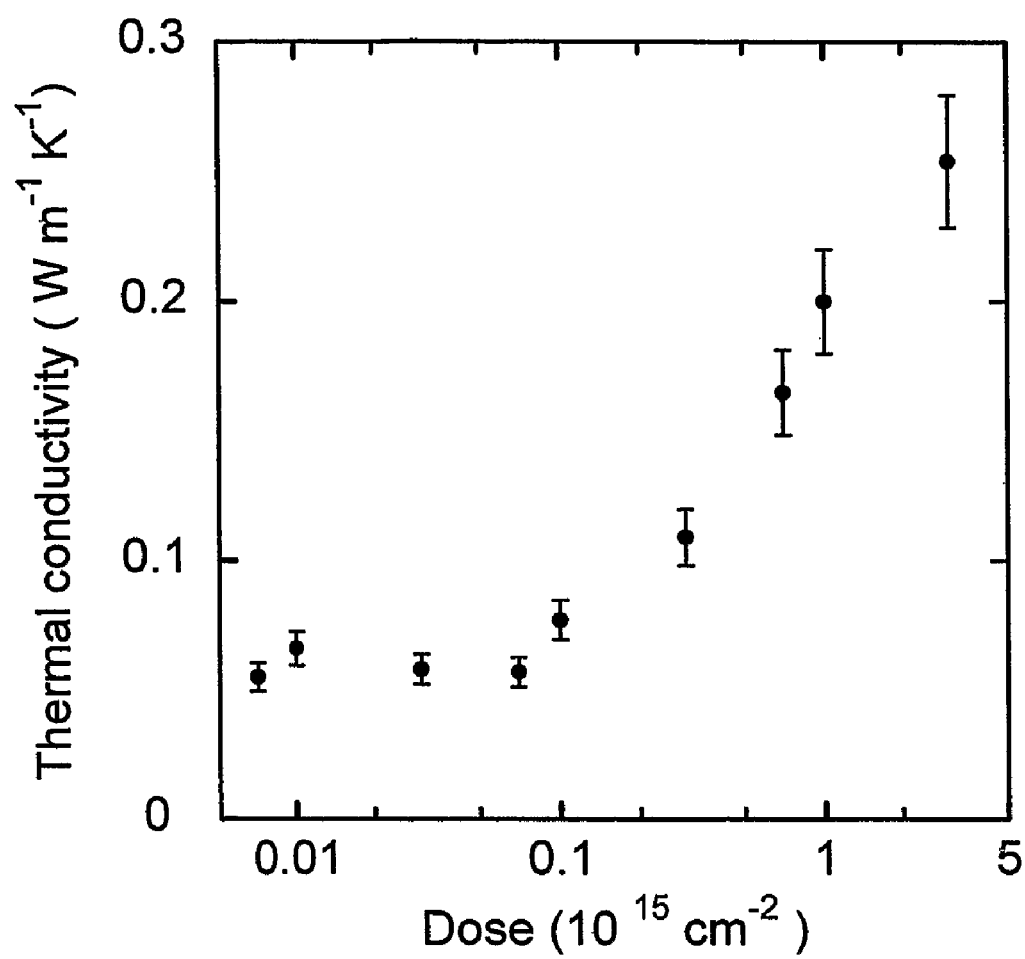
FIG. 3 is a graph of thermal conductivity as a function of irradiation dose for $WSe_2$ films having a 2 nm thickness. Irradiation was based on 1 MeV $Kr^+$ ions.
Figure 8:
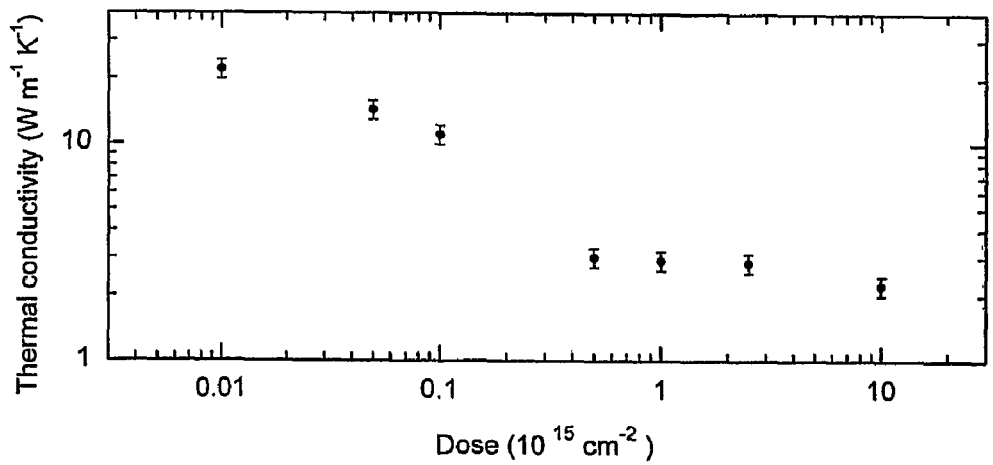
FIG. 8 is a graph of thermal conductivity of a Si substrate as a function of irradiation dose. Samples were irradiated with 1 MeV Kr$^+$ ions and doses from $1\times10^{13}$ cm$^{-2}$ to $1\times10^{16}$ cm$^{-2}$.

The data of FIGS. 1-2 suggest that very low thermal conductivities are produced by random-stacking of well-crystallized WSe$_2$ sheets. To test this idea, specimens were subjected to irradiation by energetic heavy ions to disrupt the crystalline order in the thin film samples. Thermal conductivity as a function of irradiation dose is shown in FIG. 3. Because TDTR requires knowledge of the thermal conductivity of the substrate, bare silicon substrates were irradiated with the same range of ion fluences, and the thermal conductivity of the ion-irradiated Si was also measured as shown in FIG. 8. Simulations predict that 1 MeV Kr$^+$ ions are transmitted by 24 nm thick WeSe$_2$ films and penetrate into a Si substrate to a range of ~700 nm. The effect of the ion bombardment is most visible at highest dose (3×10$^{15}$ ions cm$^{-2}$) and at that dose thermal conductivity is increased by about a factor of 5. Apparently, ion-induced damage to the stacking of WSe$_2$ sheets introduces disorder that reduces localization of vibrational energy and enhances the transfer of vibrational energy between adjacent sheets.

For further understanding of these films, models based on 6-12 Lennard-Jones (LJ) potentials of the form $$U(r) = 4\varepsilon\left[\left(\frac{\sigma}{r}\right)^{12} - \left(\frac{\sigma}{r}\right)^6\right]$$

were developed, wherein $\in$ is the energy scale and $\sigma$ is the length scale. Two sets of $\in$ and $\sigma$ parameters are used: for interactions within a single layer, $\in$=0.91 eV and $\sigma$=2.31 Å, and for the interaction between layers, $\in$=0.08 eV and $\sigma$=3.4 Å. This selection is used to achieve a reasonable fit the WSe$_2$ crystal structure and C$_{11}$ (200 GPa) and C$_{33}$ (50 GPa) elastic constants. For computation efficiency a cutoff of 5.4 Å is used, both potentials with both energy and forces shifted such that they are zero at the cutoff. The cross sectional area of the simulation cell is 15.3×13.3 Å. Along the (0001) direction two sizes were selected, 160 and 320 Å. Periodic boundary conditions were used for all directions. Newton's equations of motions were solved by the 5th order predictor corrector algorithm with a time step $\Delta t$=1.8×10$^{-15}$ s.

Figures 4, 5:
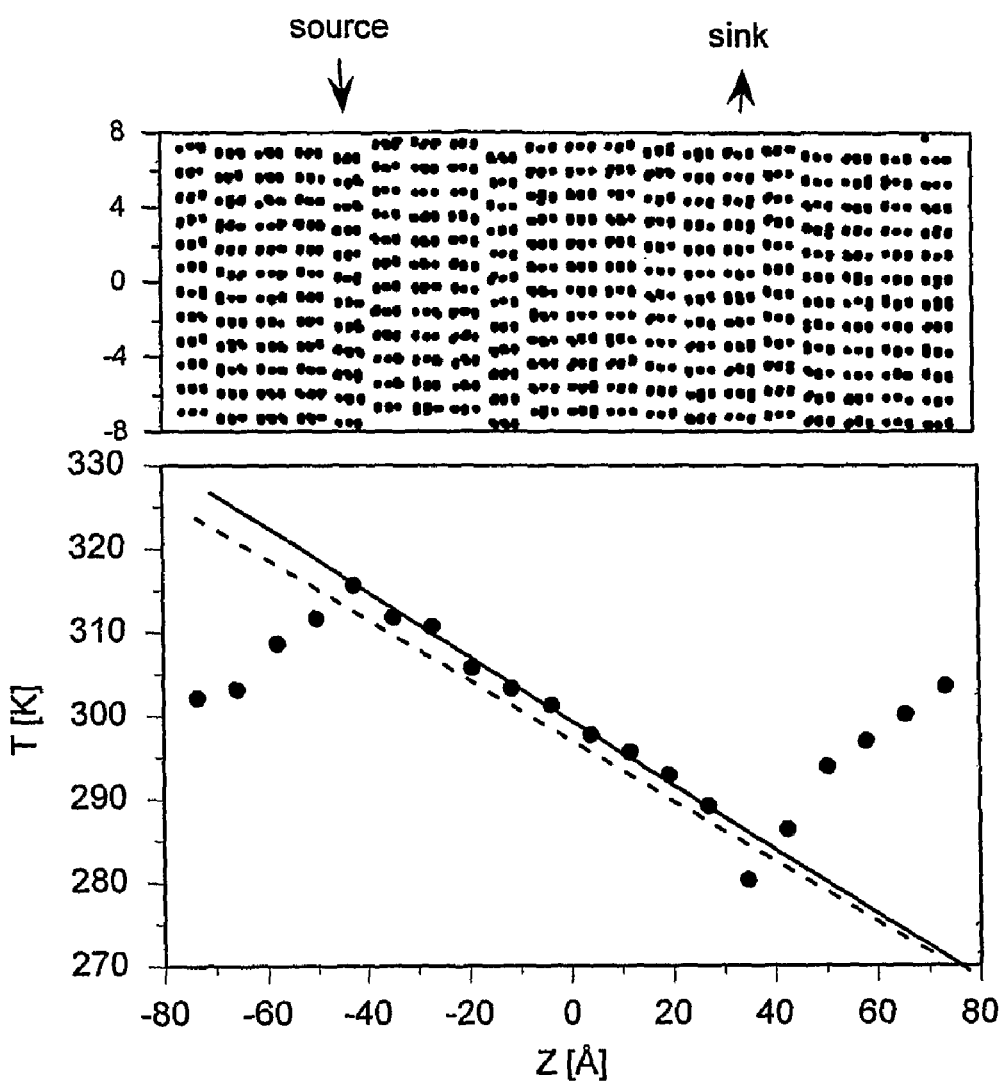
FIG. 4 illustrates atomic positions in a model layered $WSe_2$ structure corresponding to a stacking disorder. Approximate positions of a heat sink and a heat source separated by 8 mm are indicated.
FIG. 5 is a graph of a steady state temperature profile obtained with a non-equilibrium, heat source-sink method. The solid line depicts a linear fit to a central region between a heat source and a heat sink. The dashed line is an similar fit but for a structure with a heat source/heat sink separation of 16 mm.

The simulation setup for the thermal transport measurement is depicted in FIG. 4. First, the structure is equilibrated at T=300 K and zero pressure for 100,000 time steps. In the next step, the global thermostat is turned off, however, thermal energy is supplied to a WSe$_2$ layer and removed from a layer at a distance equal to the half of the cell size along the (0001) direction, labeled as the z direction. Atomic velocities were scaled up (down) in the heat source (respectively heat sink) regions such that heat was added at a constant rate of dQ/dt=10$^{-6}$ eV/time step to the source and removed at the same rate from the sink. The temperature profile along the z-direction was monitored by calculating total kinetic energy of atoms in each WSe$_2$ layer and performing time averages. Due to the small energy barrier for shearing of the WSe$_2$ structure and the small cross sectional area of the simulation cell these structures exhibited thermally exited local shearing events leading to disorder in layer stacking (FIG. 4).

After a transient time of 5 to 20 million steps depending on the system size, a steady state temperature profile is established as shown in FIG. 5. The thermal conductivity $\Lambda$ is obtained using Fourier's law. The temperature vs. position slopes and thus the thermal conductivities of 16 nm and 32 nm long structures are essentially the same within the statistical error, $\Lambda$=0.03–0.06 W m$^{-1}$ K$^{-1}$.

While the thermal conductivity of disordered, layered crystals is significantly less than the predicted minimum thermal conductivity for the cross-plane direction, the thermal conductivity of ion irradiated WSe$_2$ can be comparable to the predicted minimum thermal conductivity. These results suggest that control of both order and disorder in the disordered stacking of well-ordered crystalline sheets of a layered crystal can produce unexpected and dramatic reductions in the thermal conductivity. The WSe$_2$ films described in this example are poor electrical conductors in the cross-plane direction. Semiconductors with similar structural features and good electrical mobility can be fabricated into disordered, layered crystals to form superior thermoelectric materials.

Tungsten selenide layer fabrication is described more fully as follows. Sequential bilayers of W and Se are deposited in an ultra high vacuum chamber (10$^{-7}$ Torr background pressure) onto unheated Si (100) wafers with a stoichiometry of 1:2. Subsequent annealing is performed in an N$_2$ atmosphere to promote the formation of the desired layered structures. Films with nominal thickness of 30, 70 and 350 nm are formed. The as-deposited wafer with 30 nm WSe$_2$ nominal thickness is annealed at 625 C for 1 hour. The as-deposited wafer with 70 nm WSe$_2$ nominal thickness is divided and individual samples are annealed for 1 hour at temperatures of 200, 350, 500 and 650° C., respectively. The as-deposited wafer with 350 nm WSe$_2$ nominal thickness is also divided and individual samples are annealed for 1 hour at temperatures of 200, 625 and 650° C., respectively. An as-deposited sample of each wafer is used as control sample.

Films are characterized by x-ray diffraction (XRD), electron probe microanalysis (EPMA), and by Rutherford backscattering spectrometry (RBS). Film stoichiometry is measured using a Cameca SX-50 Electron Micro Probe Analyzer (20 nA current and 1 μm spot size) collecting data at multiple spots at 8, 12 and 16 kV beam energies. EPMA provides a reliable quantitative measure of film composition provided careful attention is paid to eliminating substrate interference and to the variation of excitation volume with incident-beam energy. Data is refined using STRATAGEM software, a thin-film composition software program that accounts for sample geometry and substrate. Total layer thickness is derived from the areal densities of W and Se measured by Rutherford backscattering spectrometry (RBS) with 2 MeV He$^+$ ions. Data from RBS measurements is analyzed using the SIMNRA software. The layered structure of the samples was studied using X-ray diffraction scans of the as-deposited and annealed samples collected on a Brucker X-Pert thin film diffractometer or at the APS UNICAT beamline. Data from X-ray scans was refined via Rietveld analysis.

Structure analysis of the samples by x-ray diffraction (XRD) shows that the films have a layered structure with as deposited samples exhibiting weak broad (001) diffraction maxima. Peak intensity and sharpness increases as a function of annealing temperature. Crystal size calculations base on the Scherrer equation yields values of 5 nm, 10 nm and 53 nm for samples with 8 (5.32 nm), 16 (10.59 nm) and 80 (52.96 nm) Se—W—Se layers respectively, implying that the entire thickness of the films have crystallized. The presence of only the (002), (006) and (008) peaks of WSe$_2$ suggests that the WSe$_2$ formed is crystallographically aligned with the substrate. The WSe$_2$ sheet thicknesses calculated from the (001) Bragg peaks parameters are 0.66 nm, larger than the 0.649 nm reported in the literature for 2H-WSe$_2$. Rietveld analysis of the structure along the c-axis suggests that this thickness increase results from a small amount of W (~3%) intercalated between the WSe$_2$ layers.

Thermal conductivity was measured using time-domain thermoreflectance using a 60-85 nm thick Al layer deposited by magnetron sputtering as a transducer layer. Because of the very low thermal diffusivity of the WSe$_2$ films, data was acquired at a low modulation of frequency for the pump beam of 580 kHz in addition to data acquired at the modulation frequency of 10 MHz that is more typical in such measurements. The pump and probe beam optical beams are focused on the surface of the samples using a microscope objective lens of 40 mm or 20 mm focal length, producing a $1/e^2$ radius of the focused spot of 12.6 or 6.3 μm, respectively. Typical laser power incident at the surface of the sample is about 3 mW for both the pump and probe beams. The steady-state temperature rise at the surface of the thin film samples is typically ~3 K, highest temperature rise being 7 K for a 343 nm layer at 88 K. Highest steady state temperature rise at the surface of the single crystal sample is 20 K at 300 K. Corrections for the sample temperature are considered in the thermal model to take into account the steady-state heating. Samples can be mounted in a $LN_2$ cryostat for measurements in a range of 90-300 K.

The thermal conductivity is determined by comparing the time dependence of ratio of the in-phase $V_{in}$ and the out-of-phase $V_{out}$ signals from a lock-in amplifier to calculations using a thermal model. The thermal model has several parameters (pump modulation frequency, laser spot size, and the thickness, thermal conductivity and heat capacity of each layer) but the thermal conductivity of the sample film or bulk crystal is the only important unknown. The aluminum layer thickness is derived from the areal density of Al measured by Rutherford backscattering spectrometry (RBS). Aluminum thermal conductivity is calculated using the Wiedemann-Franz law from 4 point probe measurements of the electrical resistivity at room temperature. Thermal conductivity of Al at lower temperatures is estimated from the values at 300 K assuming a constant residual resistivity. Heat capacity of Al and Si and the thermal conductivity of the Si are taken from the literature. Literature values for heat capacity of $WSe_2$ measured at 300K are 1.94 and 1.95 J cm$^{-3}$ K$^{-1}$, respectively. This value is 3% smaller than the value estimated from classical limit of 3 kB per atom (2.01 J cm$^{-3}$ K$^{-1}$). The thermal conductance of the Al/sample interface is also adjusted in the model to fit the data but because of the low thermal conductivities of the materials considered here, this interface conductance has very little influence on the measurement of the thermal conductivity.

The accuracy of the thermal conductivity measurement can be estimated by calculating the square-root of the sum of the squares of uncertainties propagated from measurements of the thickness and thermal conductivity of the aluminum layer, thickness of the $MoSe_2$ or $WSe_2$ film, the pump and probe beam spot radius diameters. The uncertainties propagated for each parameter are estimated by multiplying the experimental errors by the ratio of the sensitivity to the respective parameter and the sensitivity to the thermal conductivity of the transition metal diselenide film. The sensitivity is defined as:

$$S_\alpha = \frac{d\ln\left(-\frac{V_{in}}{V_{out}}\right)}{d\ln\alpha},$$

wherein α is any parameter of the thermal model

Figure 6:
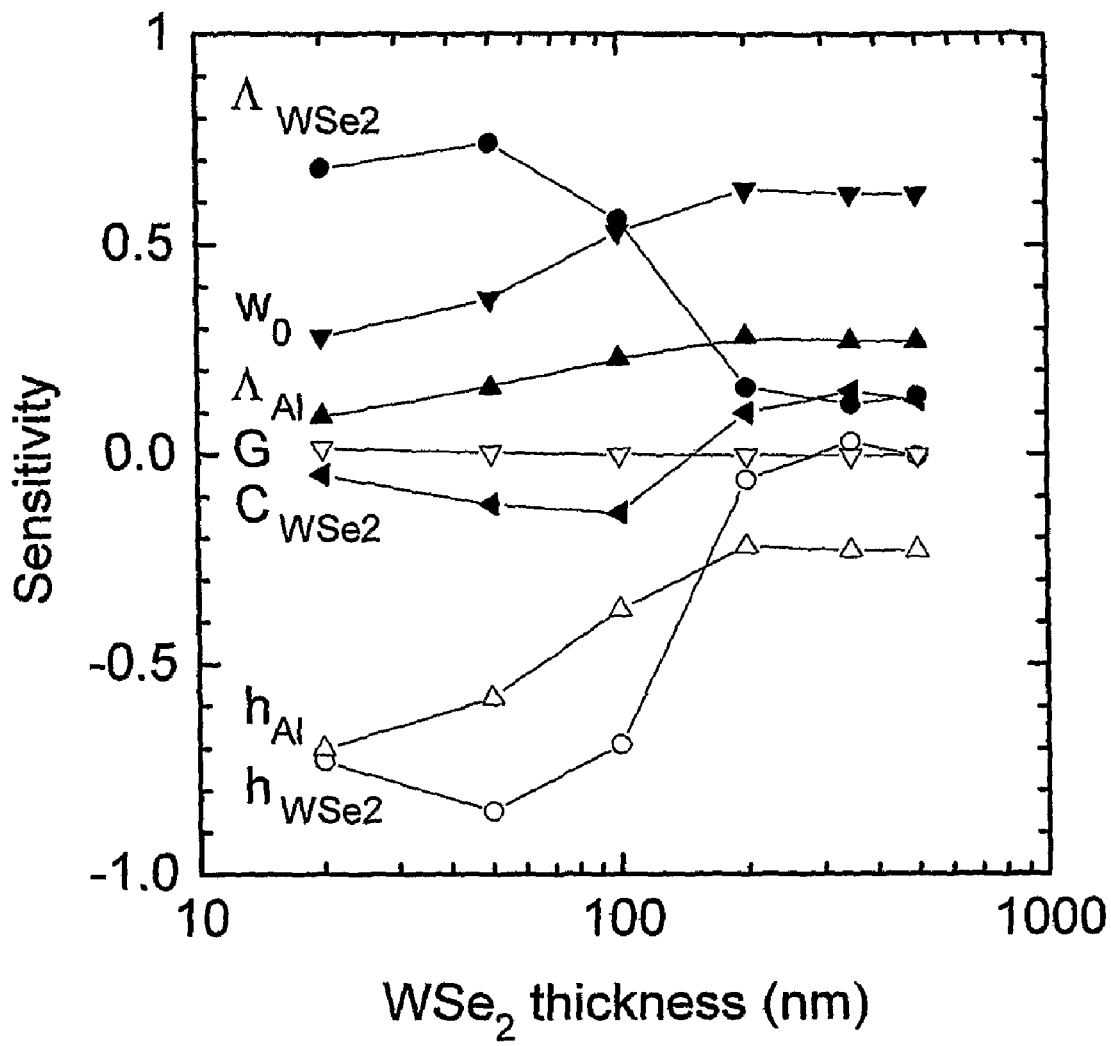
FIG. 6 illustrates sensitivities of a thermal model to various parameters plotted as function of $WSe_2$ film thickness. For these calculations, the temperature is 300K, pump beam modulation frequency is 0.580 MHz and the $1/e^2$ radius of the laser spot is $w_0=13$ microns. Parameters used for all calculations: Al layer—thickness 80 nm, thermal conductivity 200 W m$^{-1}$ K$^{-1}$, heat capacity 2.44 J cm$^{-3}$ K$^{-1}$; $WSe_2$ film—thermal conductivity 0.05 W m$^{-1}$ K$^{-1}$, heat capacity 1.95 J cm$^{-3}$ K$^{-1}$; Si substrate—thermal conductivity 142 W m$^{-1}$ K$^{-1}$, heat capacity 1.64 J cm$^{-3}$ K$^{-1}$.
Figure 7:
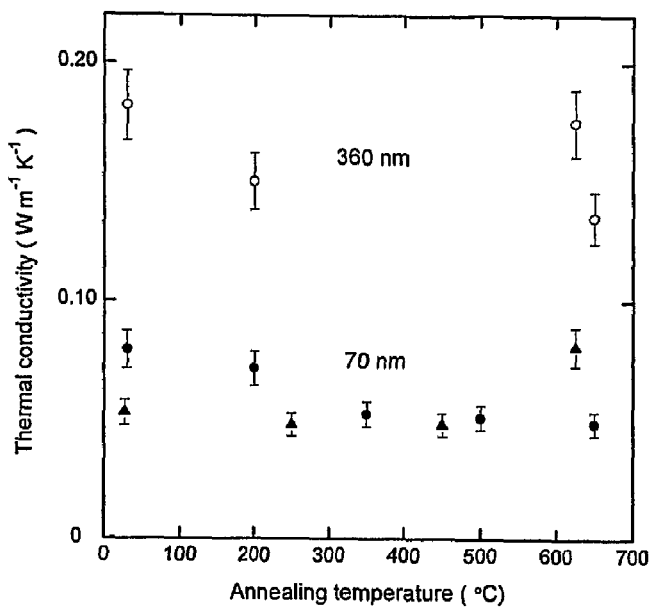
FIG. 7 is a graph of thermal conductivity as a function of annealing temperature for $WSe_2$ films with nominal thicknesses of 70 nm (full circles) and 360 nm (open circles). Annealing was done in nitrogen atmosphere for one hour at each temperature. Data for $MoSe_2$ films with nominal thickness 70 nm (full triangles) is included for comparison.

FIG. 6 shows the variation of the sensitivity factors for different parameters as a function of $WSe_2$ layer thickness. The sensitivity to thermal properties of the Al and the $WSe_2$ layer is important when the thermal penetration depth l in $WSe_2$ is larger then the thickness of the layer; $l=(D/w)^{1/2}\approx 100$ nm, where $D\approx 0.0003$ cm$^2$ s$^{-1}$ is the thermal diffusivity of the $WSe_2$ layer and $w=3.6\times 10^6$ s$^{-1}$ is the angular frequency of the modulation of the pump beam. As the thickness of the $WSe_2$ layer increases ($h_{WSe2}$>100 nm), the sensitivity factor for thermal conductivity of $WSe_2$ drops. For thicker samples, the spot size $w_0$ also becomes more important.

The uncertainties in measuring the thickness of aluminum layer, the thickness of the $WSe_2$ layer and the laser spot size are estimated at 2% each. The uncertainty for the thermal conductivity of the Al layer is estimated at 3% at 300 K and 15% at 80 K due to accuracy of the deviations from the Wiedemann-Franz law. Overall errors are shown as error bars in FIG. 2 and range between 5% at 300 K and 15% at 80 K.

Irradiation with 1 MeV Kr$^+$ ions is used to disrupt the crystalline order in the $WSe_2$ films. The fluences used are in the range of $1\times 10^{12}$ to $3\times 10^{15}$ cm$^{-2}$. Bare silicon substrates were irradiated with the same range of ion fluences and the thermal conductivity of the ion-irradiated Si (FIG. 8) was used as a parameter in the TDTR analysis of the $WSe_2$ films. A low current (30 nA) minimized the amount of self annealing in the samples. The Ion Stopping and Range in Targets module in SRIM 2003 software package is used to predict the location and extent of the buried amorphous Si layer formed in the substrates as a result of the irradiation.

Bulk materials can also be produced. For example, sequential 0.4 μm films can be prepared on six inch Si substrates coated with PMMA. Multiple films are prepared and structurally characterized to obtain enough material for the bulk samples. This thickness can be limited by the stability of the evaporation sources and quartz crystal monitors used in a deposition system. Placing these wafers in acetone dissolves the PMMA and the resulting superlattice flakes are collected via filtration. This is repeated to obtain 0.5 grams required to press a bulk pellet. Since the flakes have high aspect ratios, they stack like cards when loaded in to the hot press cell, resulting in a crystallographically aligned pressed pellet. Pellets are analyzed with a sequence of low and high angle XRD measurements, SEM, Microprobe and TEM.

The above methods can be applied to produce many other material combinations that have various layer thicknesses and total thicknesses. In addition, bulk samples can be provided. In view of the many possible embodiments to which these principles may be applied, it should be recognized that the illustrated embodiments are only preferred examples and should not be taken as limiting. Rather, the scope of the invention is defined by the following claims. We therefore claim as our invention all that comes within the scope and spirit of these claims.

We claim:

1. A composition, comprising:
   a first series of layers of a first compound;
   a second series of layers of a second compound interleaved with the layers of the first compound, wherein a thickness of the layers is in a range of between 1 nm to about 500 nm, each of the layers of the second series of layers having a crystal axis in a direction parallel to the layer, wherein the crystal axes of the layers are configured so as to be substantially randomly oriented about an axis perpendicular to a plane that is substantially parallel to the layers, wherein the first compound and the second compound are selected from a group consisting of $WSe_2$, CeSe, $NbSe_2$, BiSe, $HfTe_2$, $Sb_2Te_3$, and PbTe.

2. The composition of claim 1, wherein the thermal conductivity of the composition at 300K is less than about 0.2 W K$^{-1}$ along the axis.

3. The composition of claim 2, wherein the thermal conductivity at 300K is less than about 0.05 W m$^{-1}$ K$^{-1}$.

4. The composition of claim 2, wherein the first compound and the second compound are tungsten selenide.

5. The composition of claim 2, wherein a thickness of the layers is about 250 nm.

6. The composition of claim 1, wherein the thickness is between about 4 nm and about 75 nm.

7. The composition of claim 2, wherein each of the layers of the first series of layers is a crystalline layer.

8. The composition of claim 2, wherein thicknesses of the layers are in a range of from about 1 nm to about 250 nm.

9. The composition of claim 2, wherein the thicknesses of the layers are in a range of from about 5 nm to about 55 nm.

10. The composition of claim 1, wherein the first series of layers consists essentially of CeSe and the second series of layers consists essentially of $NbSe_2$.

11. The composition of claim 1, wherein the first series of layers consists essentially of BiSe and the second series of layers consists essentially of $NbSe_2$.

12. The composition of claim 1, wherein a total thickness of the first and second series of layers is less than about 500 nm, and the layers of at least one of the first series of layers and the second series of layers are substantially randomly oriented layers.

13. The composition of claim 1, further comprising a third series of layers of a third compound interleaved with the layers of the first compound and the second compound, wherein a thickness of the layers of the third compound is in a range of between 1 nm to about 500 nm, and wherein the third compound different from the first compound and the second compound and is selected from the group consisting of $WSe_2$, CeSe, $NbSe_2$, BiSe, $Ti_2Te_3$, $TiTe_2$, and $TiSe_2$.

14. The composition of claim 1, wherein the first compound and the second compound are tungsten selenide.

15. The composition of claim 1, wherein the first compound is $HfTe_2$ and the second compound is $Sb_2Te_3$.

16. The composition of claim 1, wherein the first compound and the second compound are selected from a group consisting of $WSe_2$, CeSe, BiSe, $HfTe_2$, $Sb_2Te_3$, and PbTe.

\* \* \* \* \*